(12) United States Patent
Hu

(10) Patent No.: US 9,691,661 B2
(45) Date of Patent: Jun. 27, 2017

(54) LOW PROFILE IC PACKAGE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/073,852

(22) Filed: Mar. 18, 2016

(65) Prior Publication Data

US 2016/0284620 A1    Sep. 29, 2016

Related U.S. Application Data

(60) Provisional application No. 62/138,464, filed on Mar. 26, 2015.

(51) Int. Cl.
| | | |
|---|---|---|
| *H01L 23/48* | (2006.01) | |
| *H01L 21/48* | (2006.01) | |
| *H01L 21/44* | (2006.01) | |
| *H01L 21/78* | (2006.01) | |
| *H01L 23/00* | (2006.01) | |
| *H01L 21/683* | (2006.01) | |

(52) U.S. Cl.
CPC .......... *H01L 21/78* (2013.01); *H01L 21/6835* (2013.01); *H01L 24/03* (2013.01); *H01L 24/06* (2013.01); *H01L 2221/68318* (2013.01); *H01L 2221/68345* (2013.01); *H01L 2221/68359* (2013.01); *H01L 2224/02373* (2013.01); *H01L 2224/0401* (2013.01); *H01L 2224/06182* (2013.01)

(58) Field of Classification Search
CPC . H01L 23/31; H01L 23/3114; H01L 23/3128; H01L 24/14; H01L 24/25; H01L 24/19; H01L 24/82; H01L 33/62; H01L 2224/023; H01L 2224/0231; H01L 2224/0233; H01L 2224/02331; H01L 2224/02333; H01L 2224/0235; H01L 2224/02373
USPC ........ 257/734, 737, 738; 438/110, 127, 612, 438/613, 614
See application file for complete search history.

(56) References Cited

U.S. PATENT DOCUMENTS

| | | | |
|---|---|---|---|
| 8,269,337 B2 | 9/2012 | Hu et al. | |
| 9,431,335 B2* | 8/2016 | Hu | ..................... H01L 23/49894 |
| 2015/0050779 A1* | 2/2015 | Tsai | ....................... H01L 21/486 |
| | | | 438/113 |
| 2015/0145142 A1* | 5/2015 | Lin | ......................... H01L 25/50 |
| | | | 257/774 |
| 2015/0287700 A1* | 10/2015 | Yu | ....................... H01L 23/5386 |
| | | | 257/774 |
| 2016/0118311 A1* | 4/2016 | Hu | ......................... H01L 23/13 |
| | | | 257/737 |

* cited by examiner

*Primary Examiner* — Hsien Ming Lee
(74) *Attorney, Agent, or Firm* — Hauptman Ham, LLP

(57) ABSTRACT

An IC package without using an interposer is disclosed to form a low profile IC package. A single redistribution layer is fabricated according to IC process. A plurality of bottom pads is formed on a bottom of the single redistribution layer adaptive for the IC package to mount onto a mother board. A plurality of top pads is formed on a top of the single redistribution layer. An IC chip mounts on the plurality of top pads. A first molding compound wraps the single redistribution layer on four sides; and a second molding compound embeds the IC chip on top of the redistribution layer.

20 Claims, 13 Drawing Sheets

LOW PROFILE IC PACKAGE

RELATED APPLICATIONS

The present application claims the benefit of U.S. Provisional Application No. 62/138,464, filed Mar. 26, 2015, the disclosure of which is hereby incorporated by reference herein in its entirety.

BACKGROUND

Technical Field

The present invention relates to a high density redistribution film prepared for IC package. Especially for a low profile IC package which has a single redistribution layer as a package substrate without using-an interposer.

Description of Related Art

FIG. 1 show a prior art

FIG. 1 shows a prior art U.S. Pat. No. 8,269,337 which discloses an IC package. The IC package comprises an IC chip 27 mounted on a top of a package substrate. The package substrate includes an interposer 21, a top redistribution layer 213 configured on top of the interposer 21, and a bottom redistribution layer 24 configured on a bottom of the interposer 21. A width of the bottom redistribution layer 24 is greater than a width of the interposer 21. A molding compound 22 wraps the top redistribution layer 213 and the interposer 21. Due to the tendency of miniaturization for IC package, an even thinner package has been pursued in the IC package technology for a long time.

A typical thickness for each layer of the IC package as shown in FIG. 1 is as follows:

L1=4 um, for the top first circuit layer fabricated according to IC process;

L2=8 um, for the top second circuit layer fabricated according to IC process;

L3=100 um, for the interposer 21;

L4=8 um, for the bottom first circuit layer fabricated according to IC process;

L5=40 um, for the bottom second circuit layer; fabricated according to PCB process; and L6=40 um, for the bottom third circuit layer; fabricated according to PCB process. A total thickness is 200 um for the package substrate on bottom of the IC chip 27.

DETAILED DESCRIPTION OF THE INVENTION

Figure 2:
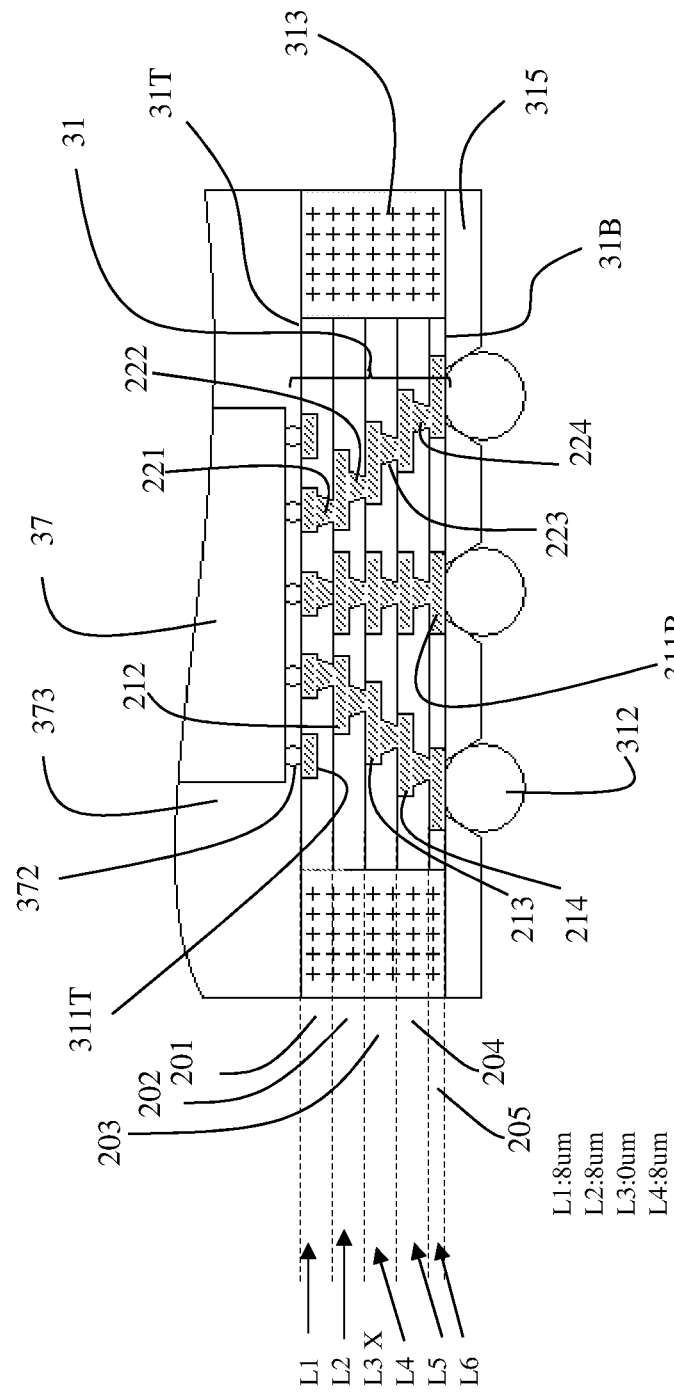
FIG. 2 shows a low profile IC package according to the present invention.

FIG. 2 shows a low profile IC package according to the present invention.

FIG. 2 shows a low profile IC package which comprises a single redistribution layer 31. The single redistribution layer 31 further comprises a plurality of dielectric material layers 201, 202, 203, 204, 205 stacked one on top another in a thickness direction of the single redistribution layer 31, and a redistribution circuitry embedded in the dielectric material layers 201-205. The redistribution circuitry comprises a plurality of bottom pads 311B at a bottommost surface 31B of the bottommost dielectric material layer 205, a plurality of top pads 311T at a topmost surface 31T of the topmost dielectric material layer 201, a plurality of conductive layers 212, 213, 214 embedded in the dielectric material layers 202, 203, 204, respectively, and a plurality of conductive vias 221, 222, 223, 224 embedded in the dielectric material layers 201, 202, 203, 204, respectively. The bottom pads 311B have a pad dimension and pad density adaptive for the IC package to mount onto a mother board (not shown), and the top pads 311T have a pad dimension and pad density adaptive for an IC chip 37 to mount thereon. The conductive layers 212-214 are stacked one above another in the thickness direction between the bottom pads 311B and the top pads 311T. The conductive vias 221-224 electrically couple the conductive layers 212-214 with each other and with the bottom pads 311B and the top pads 311T. A first monolithic molding compound 313 wraps around the single redistribution layer 31 on four sides. As shown in FIG. 2, the first monolithic molding compound 313 has a side face in direct contact with side faces of the dielectric material layers 201-205.

FIG. 2 shows an IC chip 37 is mounted on top of the single redistribution layer 31; and a second molding compound 373 configured on top of the single redistribution layer 31 and configured on top of the first molding compound 313; the IC chip 37 is embedded in the second molding compound 373.

A plurality of first solder balls 312 is configured on a bottom of the single redistribution layer 31 for a connection between the IC package and a mother board (not shown) to which the IC package is going to mount on. A plurality of second solder balls 372 is configured on a bottom of the IC chip 37 for a connection between the IC chip 37 and the single redistribution layer 31.

FIG. 2 shows a solder resist layer 315 is configured on bottom of the single redistribution layer 31. The plurality of bottom pads 311B is exposed out of the solder resist layer 315. A plurality of first solder balls 312 is formed, each of the first solder balls 312 is configured on a bottom of a corresponding exposed bottom pad 311B.

A typical thickness for each layer of the IC package as shown in FIG. 2 according to the present invention is as follows:

L1=8 um, for the top first circuit layer fabricated according to IC process;

L2=8 um, for the top second circuit layer fabricated according to IC process;

L3=0 um, no interposer is needed;

L4=8 um, for the bottom first circuit layer fabricated according to IC process;

L5=8 um, for the bottom second circuit layer; fabricated according to IC process; and L6=4 um, for the bottom third circuit layer; fabricated according to IC process.

Figure 1:
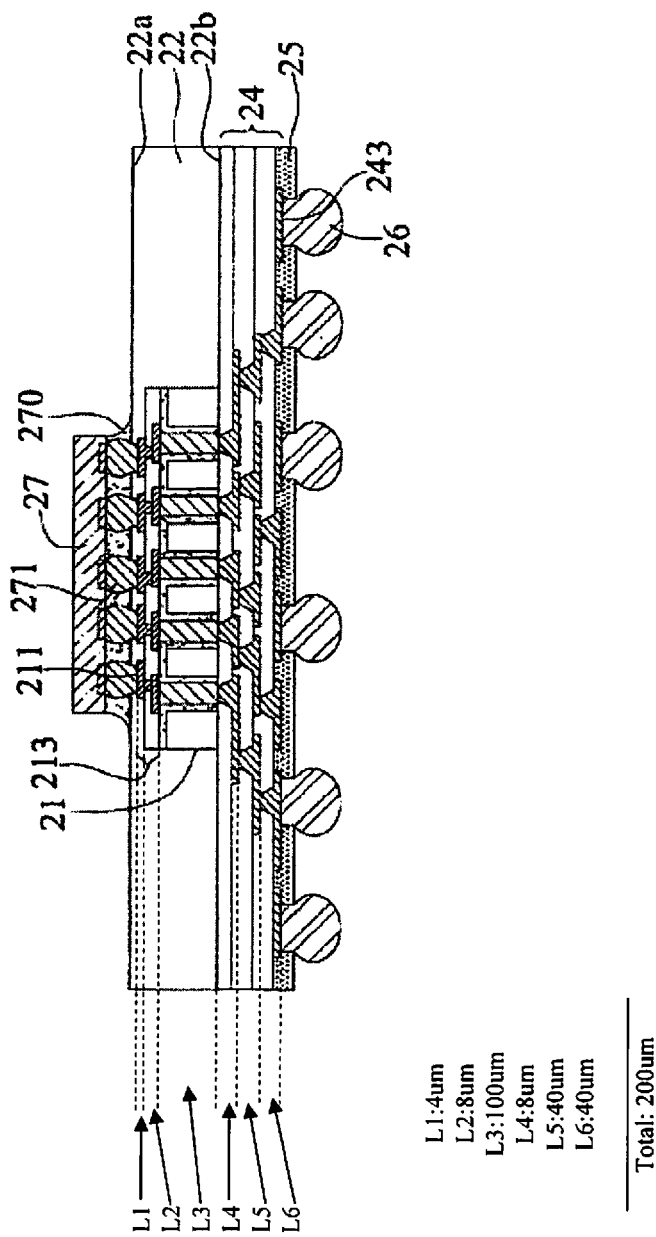
FIG. 1 show a prior art.

A total thickness 36 um for the package substrate is obtained according to the present invention. As compared with the 200 um thickness of the traditional package substrate of FIG. 1, only 18% (36 um/200 um=18%) of the thickness of the traditional package substrate results in a great reduction in height for the package substrate according to the present invention.

The key feature according to the present invention is that no interposer is needed in the single redistribution layer 31 as shown in FIG. 2 so that a low profile IC package can be obtained.

FIGS. 3~10 show a fabrication process for a low profile IC package fabricated according to IC process.

Figure 3:
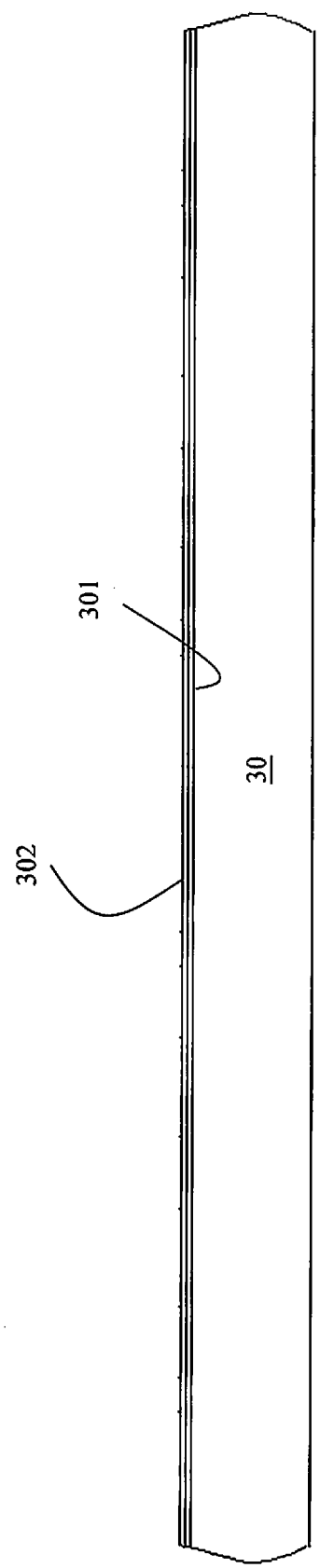
FIGS. 3~10 show a fabrication process for a low profile IC package according to IC processes.

FIG. 3 shows:
preparing a temporary carrier 30;
forming a layer of releasing layer 301 on top of the temporary carrier 30; and
forming a layer of seed layer 302 on top of the releasing layer 301.

Figure 4:
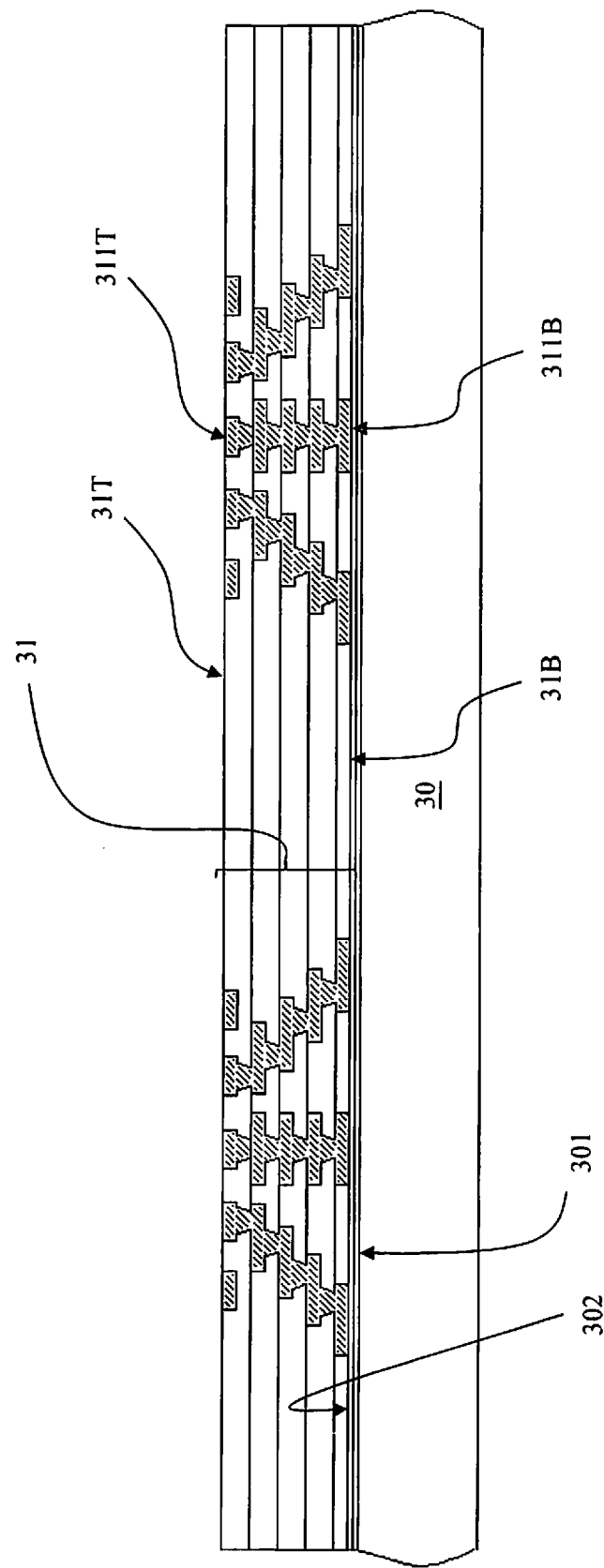

FIG. 4 shows:
Forming a redistribution layer 31 on top of the seed layer 302; wherein a plurality of bottom pads 311B formed on bottom having a pad dimension and pad density adaptive for the IC package to mount onto a mother board (not shown); and a plurality of top pads 311T formed on top having a pad dimension and pad density adaptive for an IC chip to mount thereon.

Figure 5:
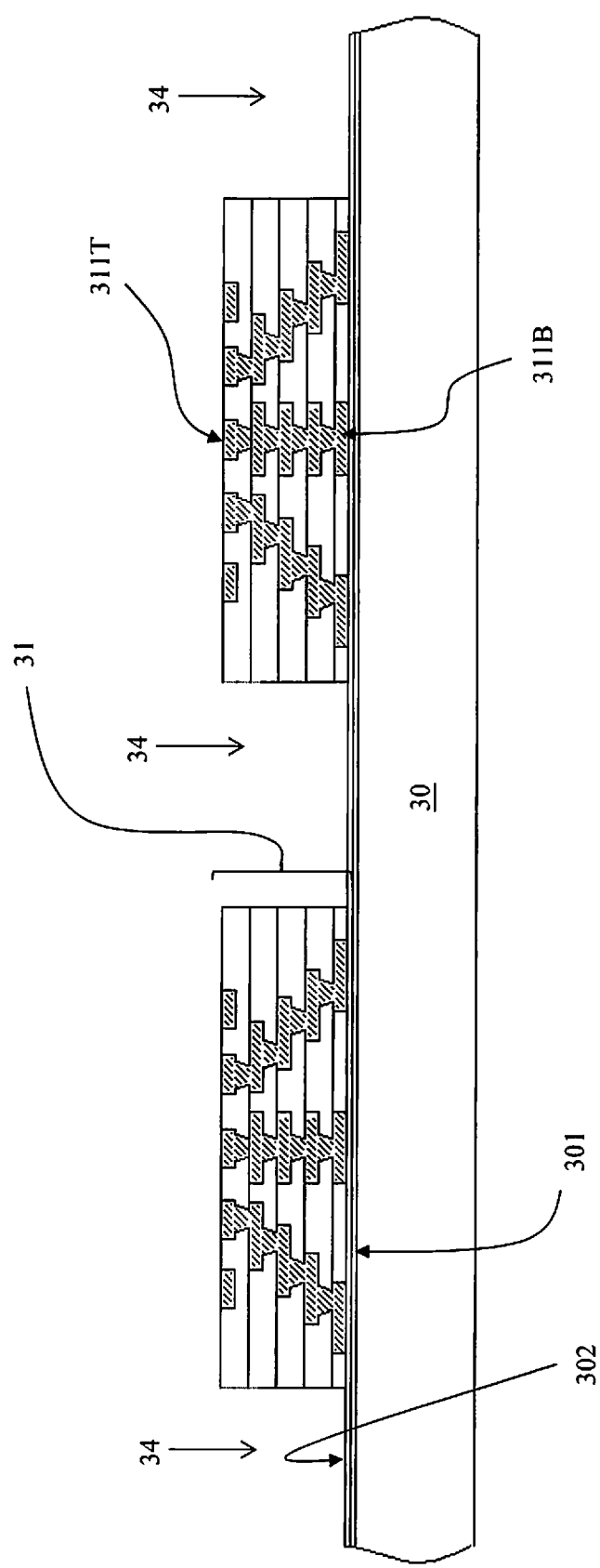

FIG. 5 shows:
etching dielectric material between units; a plurality of trenches 34 formed to surround four sides of each unit.

Figure 6:
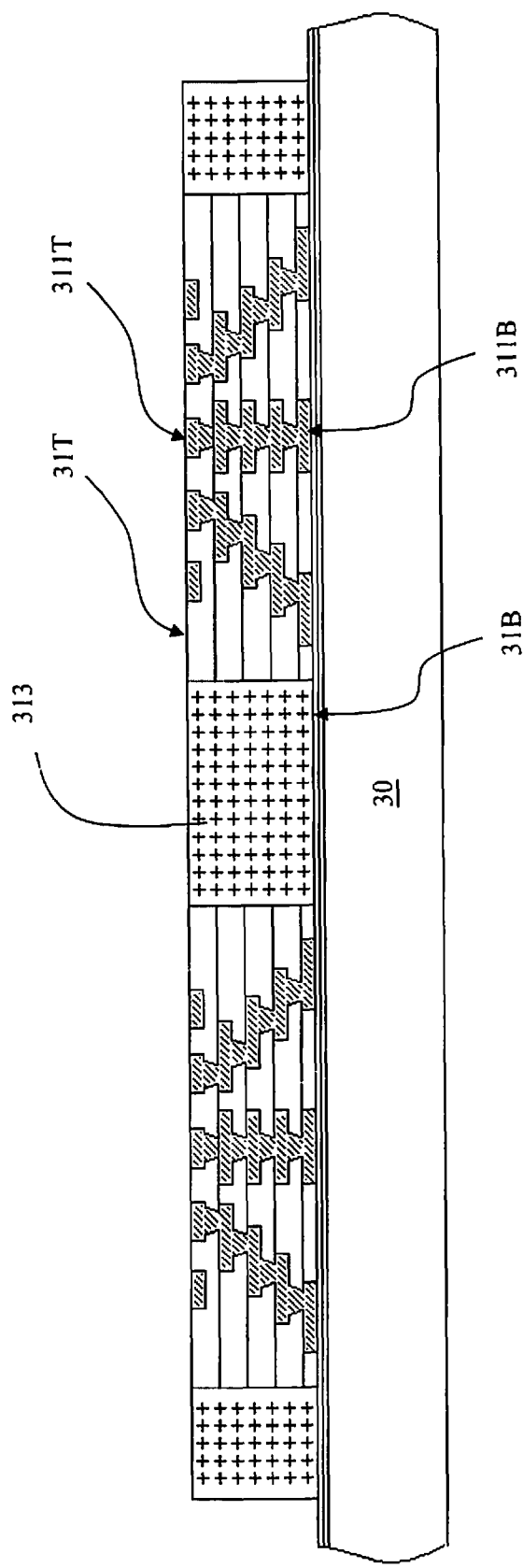

FIG. 6 shows:
molding to wrap each unit on four sides with a first molding compound 313.

Figure 7:
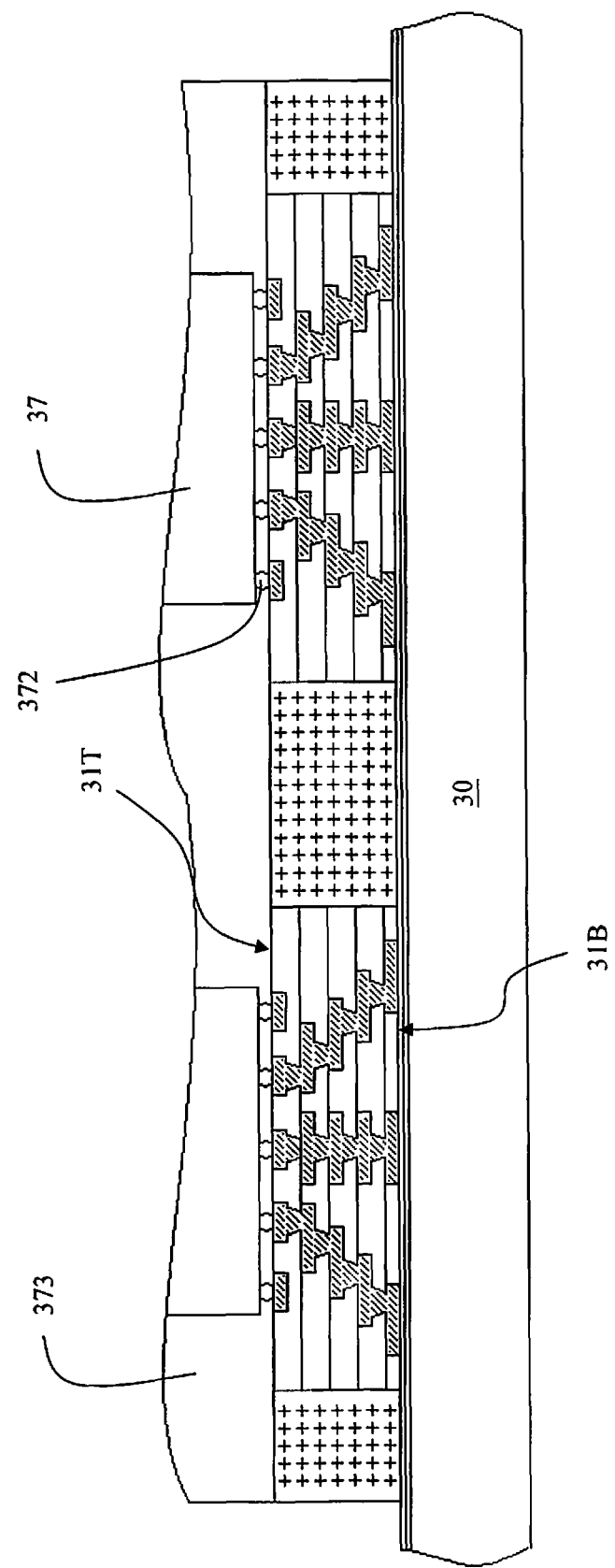

FIG. 7 shows:
mounting an IC chip 37 on top of the single redistribution layer 31;
molding the IC chip on top of the redistribution layer 31 with a second molding compound 373.

Figure 8:
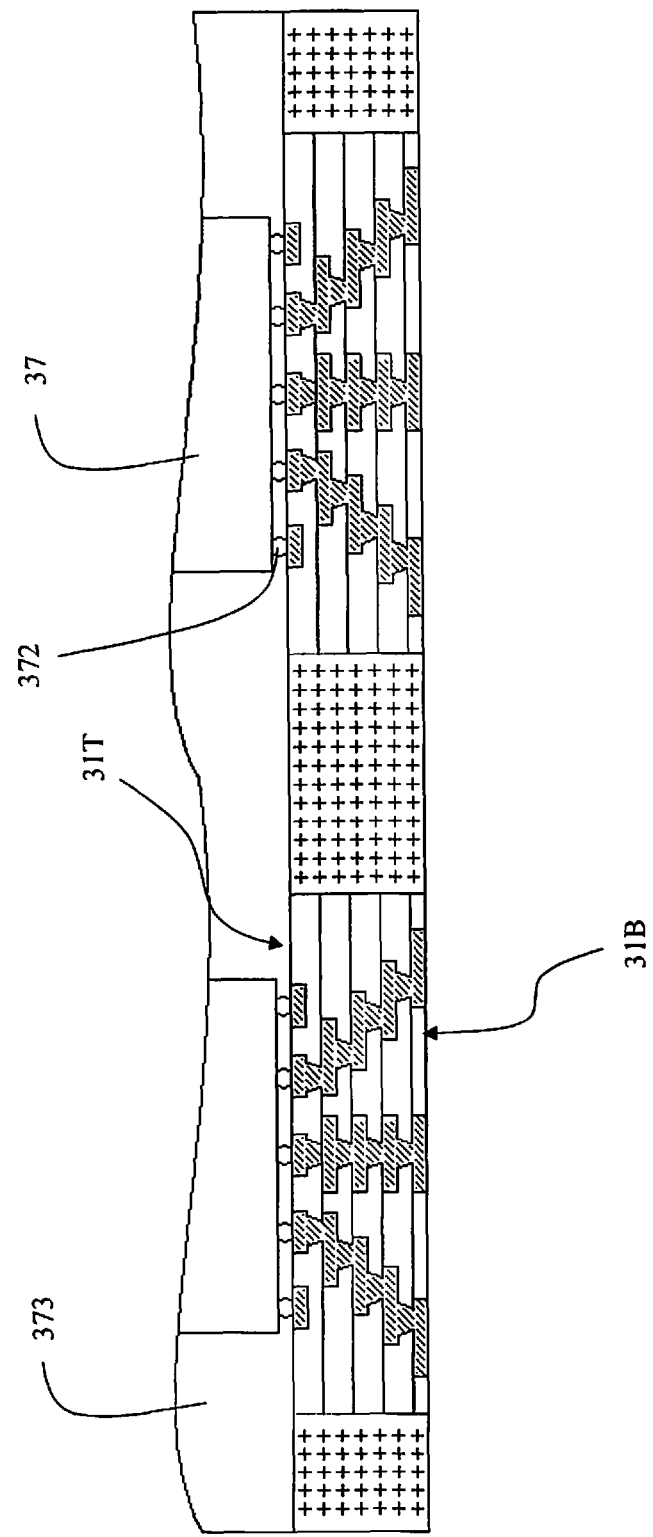

FIG. 8 shows:
removing the temporary carrier 30; and
removing the seed layer 302.

Figure 9:
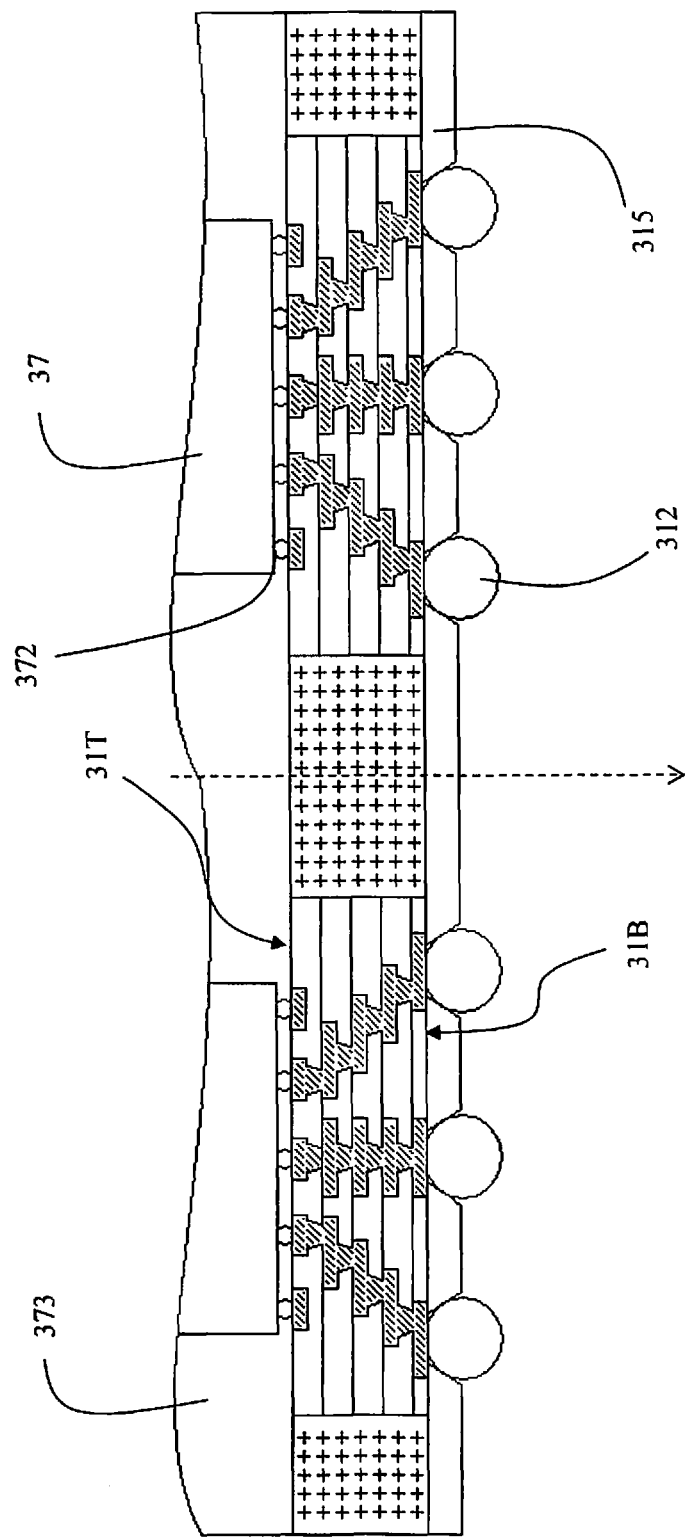

FIG. 9 shows:
forming a layer of solder resist 315 on bottom to reveal a bottom surface of each bottom pad 311B;
planting a plurality of solder balls 312, each solder balls 312 is configured on a corresponding one of the bottom pads 312; and
singulating to produce a plurality of the IC package units.

Figure 10:
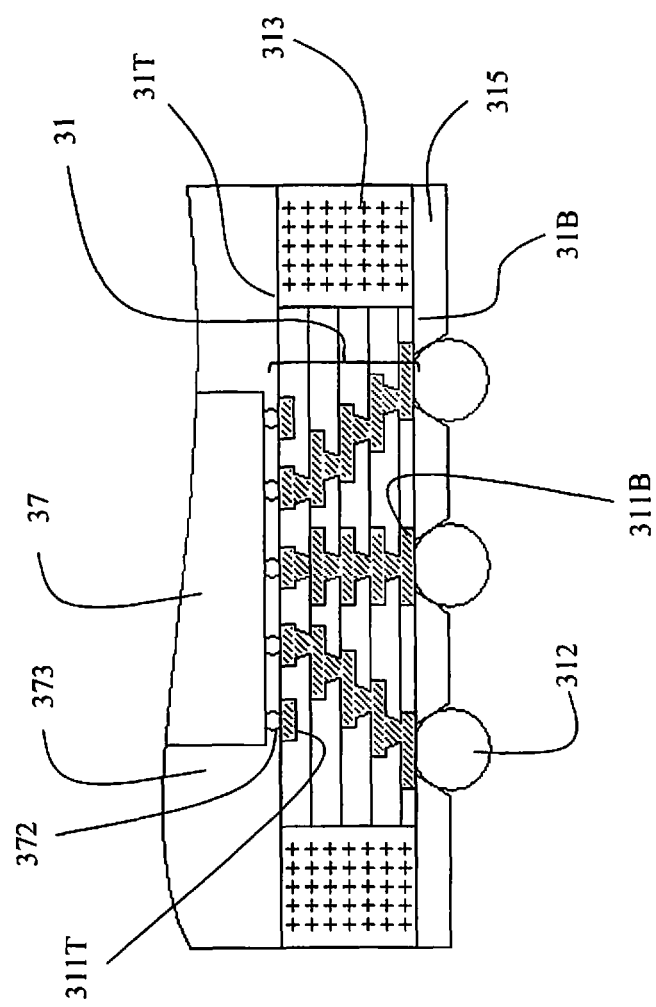

FIG. 10 shows:
a low profile IC package according to the present invention is fabricated.

Figure 11:
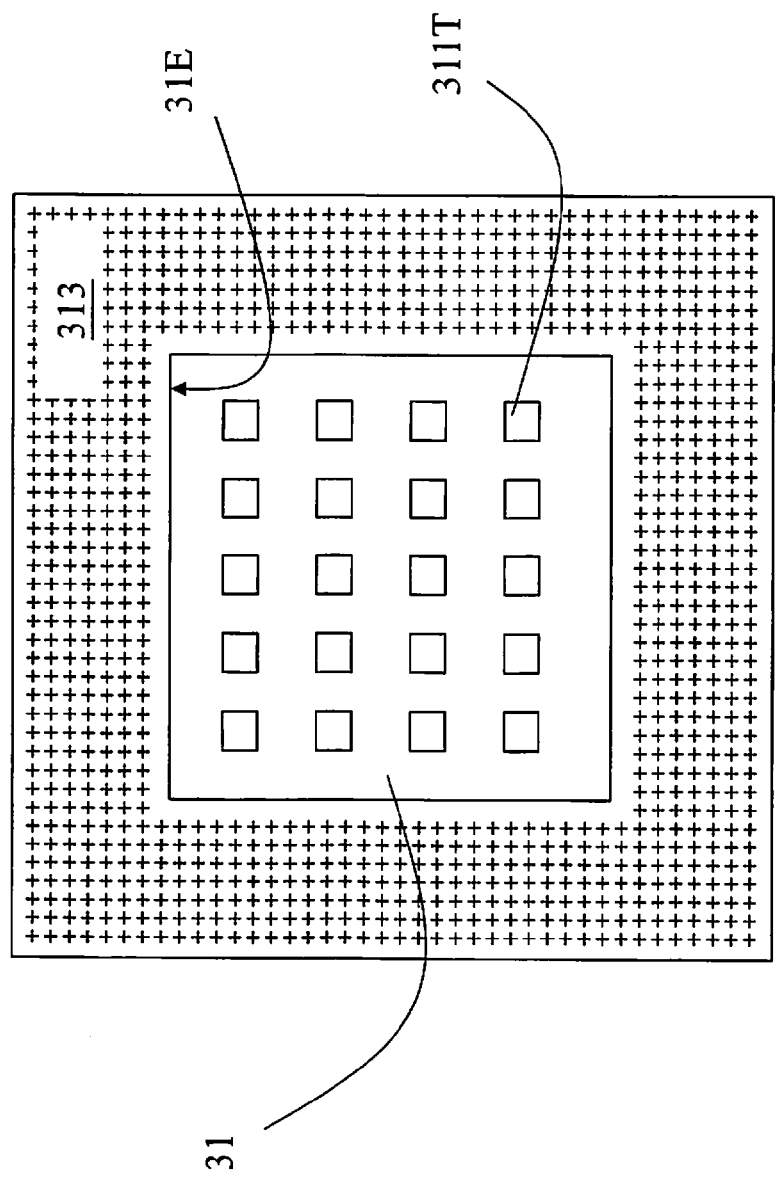
FIG. 11 shows a top view of the package substrate according the present invention.

FIG. 11 shows a top view of the package substrate according the present invention.

FIG. 11 shows a top view of the package substrate of FIG. 6. where each edge 31E of the redistribution layer 31 is made flat. In other words, the interface 31E between the redistribution layer 31 and the first molding compound 313 on each side of is flat.

Figure 12:
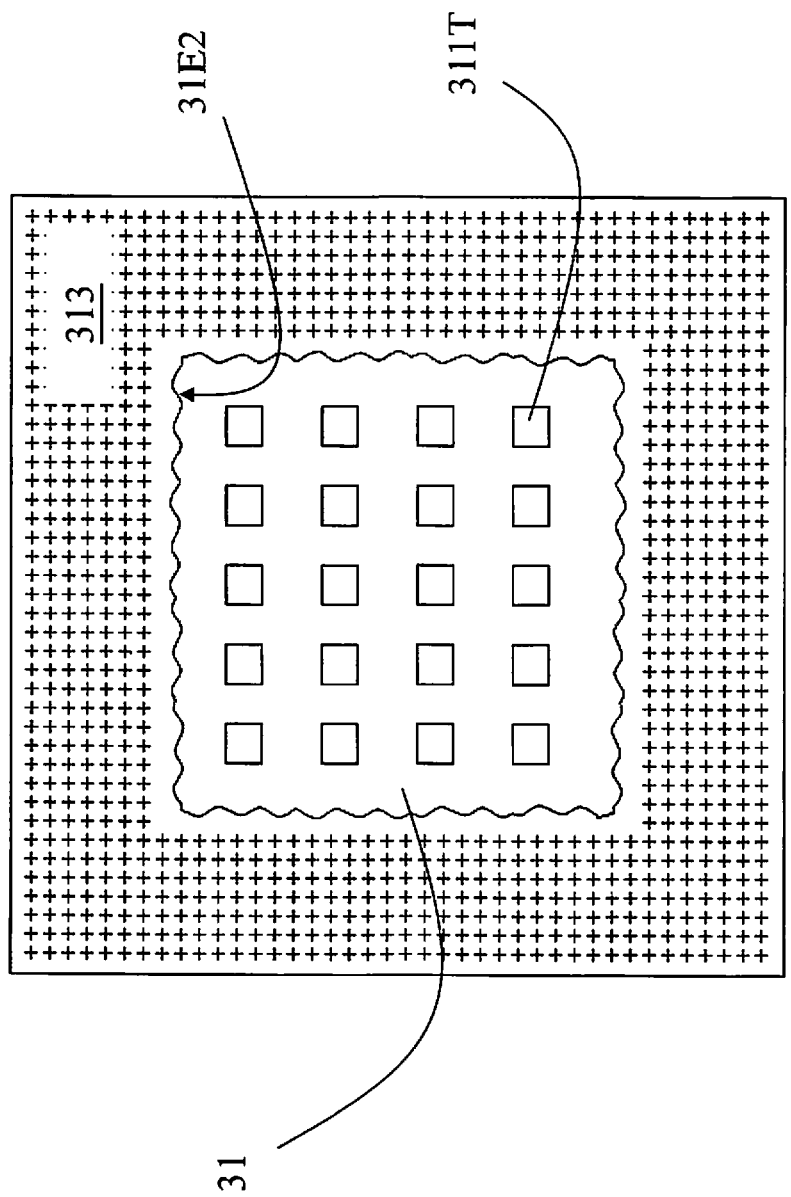
FIG. 12 shows a top view for a second embodiment of the package substrate according the present invention.

FIG. 12 shows a top view for a second embodiment of the package substrate according the present invention.

FIG. 12 shows a top view for a second embodiment of the package substrate, where each edge 31E2 of the redistribution layer 31 is made zigzag to enhance bonding forces between the redistribution layer 31 and the first molding compound 313. In other words, the interface 31E2 between the redistribution layer 31 and the first molding compound 313 on each side is made zigzag. The zigzag can be formed through programmed laser etching or other process.

Figure 13:
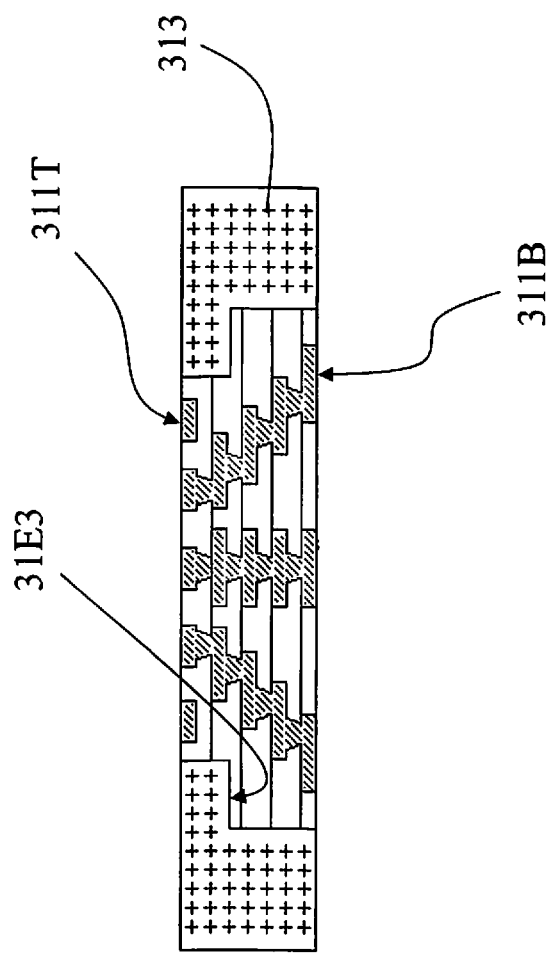
FIG. 13 shows a top view for a third embodiment of the package substrate according the present invention.

FIG. 13 shows a top view for a third embodiment of the package substrate according the present invention.

FIG. 13 shows a side view for a third embodiment of the package substrate, where each edge 31E3 of the redistribution layer 31 is made a step to enhance bonding forces between the redistribution layer 31 and the first molding compound 313. In other words, the interface 31E3 between the redistribution layer 31 and the first molding compound 313 on each side is made a step. The step can be formed through programmed laser etching or other process.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A low profile IC package, comprising:
a single redistribution layer comprising:
a plurality of dielectric material layers stacked one on top another in a thickness direction of the single redistribution layer; and
a redistribution circuitry embedded in the plurality of dielectric material layers, the redistribution circuitry comprising:
a plurality of bottom pads at a bottommost surface of a bottommost dielectric material layer among the plurality of dielectric material layers, the plurality of bottom pads having a pad dimension and pad density configured for the IC package to mount onto a mother board;
a plurality of top pads at a topmost surface of a topmost dielectric material layer among the plurality of dielectric material layers, the plurality of top pads having a pad dimension and pad density configured for an IC chip to mount thereon;
a plurality of conductive layers embedded in the plurality of dielectric material layers, and stacked one above another in the thickness direction between the plurality of bottom pads and the plurality of top pads; and
a plurality of conductive vias embedded in the plurality of dielectric material layers, and electrically coupling the plurality of conductive layers with each other and with the plurality of bottom pads and the plurality of top pads; and
a first monolithic molding compound wrapping around the single redistribution layer on four sides of the single redistribution layer, wherein
the IC package is free of any interposer, and
the first monolithic molding compound has a side face in direct contact with side faces of the plurality of dielectric material layers.

2. A low profile IC package as claimed in claim 1 further comprising:
an IC chip mounted on top of the single redistribution layer; and
a second molding compound on top of the single redistribution layer and the first monolithic molding compound, wherein
the IC chip is embedded in the second molding compound.

3. A low profile IC package as claimed in claim 2 further comprising:
a solder resist layer on bottom of the single redistribution layer, wherein the plurality of bottom pads are exposed out of the solder resist layer; and
a plurality of solder balls, each on a bottom of a corresponding exposed bottom pad among the plurality of bottom pads.

4. A low profile IC package as claimed in claim 3, wherein the IC chip mounted directly on the plurality of top pads, and each of the plurality of solder balls is directly on the corresponding exposed bottom pad among the plurality of bottom pads.

5. A low profile IC package as claimed in claim 1 wherein, in a plan view along the thickness direction of the dielectric material, at least one side of the four sides of the single redistribution layer has a zigzag shape.

6. A low profile IC package as claimed in claim 1, wherein, in a cross-section view taken along the thickness direction of the dielectric material,
the single redistribution layer has a step along at least one side of the four sides of said single redistribution layer, and
the first molding compound has another step corresponding to the step of said single redistribution layer.

7. A low profile IC package as claimed in claim 1, wherein
a topmost surface of the first monolithic molding compound is flush with the topmost surface of the topmost dielectric material layer, and with topmost surfaces of the plurality of top pads, and
a bottommost surface of the first monolithic molding compound is flush with the bottommost surface of the bottommost dielectric material layer, and with bottommost surfaces of the plurality of bottom pads.

8. A low profile IC package as claimed in claim 7, further comprising:
an IC chip mounted directly on the plurality of top pads; and
a second monolithic molding compound on top of the single redistribution layer and the first monolithic molding compound, wherein
the IC chip is embedded in the second molding compound, and
a bottommost surface of the second molding compound is in direct contact with the topmost surface of the first monolithic molding compound and the topmost surface of the topmost dielectric material layer.

9. A low profile IC package as claimed in claim 8, further comprising:
a solder resist layer on bottom of the single redistribution layer, wherein the plurality of bottom pads are exposed out of the solder resist layer; and
a plurality of solder balls, each directly on a bottom of a corresponding exposed bottom pad among the plurality of bottom pads, wherein
a topmost surface of the solder resist layer is in direct contact with the bottommost surface of the first monolithic molding compound and the bottommost surface of the bottommost dielectric material layer.

10. A fabrication process, comprising:
forming a single redistribution layer on top of a temporary carrier wherein the single redistribution layer comprises:
a dielectric material; and
a redistribution circuitry embedded in the dielectric material, the redistribution circuitry comprising:
a plurality of bottom pads formed at a bottommost surface of the dielectric material, the plurality of bottom pads having a pad dimension and pad density configured for the IC package to mount onto a mother board;
a plurality of top pads formed at a topmost surface of the dielectric material, the plurality of top pads having a pad dimension and pad density configured for an IC chip to mount thereon;
a plurality of conductive layers stacked one above another in a thickness direction of the dielectric material between the plurality of bottom pads and the plurality of top pads; and
a plurality of conductive vias electrically coupling the plurality of conductive layers with each other and with the plurality of bottom pads and the plurality of top pads;
after said forming the single redistribution layer, etching the dielectric material to divide the single redistribution layer into a plurality of redistribution layer units;
after said etching, forming a first molding compound to wrap each redistribution layer unit among the plurality of redistribution layer units on four sides of the redistribution layer unit;
after said forming the first molding compound, mounting a plurality of IC chips each on top of a corresponding redistribution layer unit among the plurality of redistribution layer units;
after said mounting the plurality of IC chips, forming a second molding compound on top of the plurality of redistribution layer units and the first molding compound to embed the plurality of IC chips in the second molding compound;
after said forming the second molding compound, removing the temporary carrier; and
after said removing the temporary carrier, singulating to produce a plurality of IC packages.

11. A fabrication process as claimed in claim 10, further comprising:
before said forming the single redistribution layer,
forming a releasing layer on top of the temporary carrier; and
forming a seed layer on top of the releasing layer, wherein the single redistribution layer is formed on top of the seed layer; and
after said removing the temporary carrier and before said singulating,
removing the seed layer;
forming a solder resist layer on bottom of the single redistribution layer while leaving the plurality of the bottom pads exposed from the solder resist layer; and
planting a plurality of solder balls each on a corresponding exposed bottom pad among the plurality of bottom pads.

12. A fabrication process as claimed in claim 10, wherein the single redistribution layer is free of an interposer.

13. A fabrication process as claimed in claim 12, wherein a material of the first molding compound is different from the dielectric material in the single redistribution layer.

14. A fabrication process as claimed in claim 12, wherein
said etching the dielectric material comprises forming a plurality of trenches in the dielectric material, each trench among the plurality of trenches extending in the thickness direction through an entire thickness of the dielectric material, and
said forming the first molding compound comprises completely filling the plurality of trenches with the first molding compound.

15. A fabrication process as claimed in claim 12, wherein, in a plan view along the thickness direction of the dielectric material, at least one side of the four sides of each redistribution layer unit among the plurality of redistribution layer units has a zigzag shape.

16. A fabrication process as claimed in claim 12, wherein, in a cross-section view taken along the thickness direction of the dielectric material, each redistribution layer unit among the plurality of redistribution layer units has a step along at least one side of the four sides of said redistribution layer unit, and the first molding compound has another step corresponding to the step of said redistribution layer unit.

17. A low profile IC package, comprising:
a single redistribution layer comprising:
   a dielectric material; and
   a redistribution circuitry embedded in the dielectric material, the redistribution circuitry comprising:
      a plurality of bottom pads at a bottommost surface of the dielectric material, the plurality of bottom pads having a pad dimension and pad density configured for the IC package to mount onto a mother board;
      a plurality of top pads at a topmost surface of the dielectric material, the plurality of top pads having a pad dimension and pad density configured for an IC chip to mount thereon;
      a plurality of conductive layers stacked one above another in a thickness direction of the dielectric material between the plurality of bottom pads and the plurality of top pads; and
      a plurality of conductive vias electrically coupling the plurality of conductive layers with each other and with the plurality of bottom pads and the plurality of top pads; and
a first molding compound wrapping around the single redistribution layer on four sides of the single redistribution layer, wherein
the IC package is free of any interposer,
a topmost surface of the first molding compound is flush with the topmost surface of the dielectric material, and with topmost surfaces of the plurality of top pads, and
a bottommost surface of the first molding compound is flush with the bottommost surface of the dielectric material, and with bottommost surfaces of the plurality of bottom pads.

18. A low profile IC package as claimed in claim 17, further comprising:
   an IC chip mounted directly on the plurality of top pads; and
   a second molding compound on top of the single redistribution layer and the first molding compound, wherein
   the IC chip is embedded in the second molding compound, and
   a bottommost surface of the second molding compound is in direct contact with the topmost surface of the first molding compound and the topmost surface of the dielectric material.

19. A low profile IC package as claimed in claim 18, further comprising:
   a solder resist layer on bottom of the single redistribution layer, wherein the plurality of bottom pads are exposed out of the solder resist layer; and
   a plurality of solder balls, each directly on a bottom of a corresponding exposed bottom pad among the plurality of bottom pads, wherein
   a topmost surface of the solder resist layer is in direct contact with the bottommost surface of the first molding compound and the bottommost surface of the dielectric material.

20. A low profile IC package as claimed in claim 17, wherein, in a plan view along the thickness direction of the dielectric material, each of the four sides of the single redistribution layer has a zigzag shape.

* * * * *